(12) United States Patent
Cattelan et al.

(10) Patent No.: US 7,573,919 B2
(45) Date of Patent: Aug. 11, 2009

(54) WAVELENGTH CONTROL OF AN EXTERNAL-CAVITY TUNEABLE LASER

(75) Inventors: Susanna Maria Cattelan, Milan (IT); Andrea Romano, Milan (IT); Marco De Donno, Milan (IT); Aurelio Pianciola, Milan (IT)

(73) Assignees: PGT Photonics S.p.A., Milan (IT); Telecom Italia S.p.A., Milan (IT)

( * ) Notice: Subject to any disclaimer, the term of this patent is extended or adjusted under 35 U.S.C. 154(b) by 0 days.

(21) Appl. No.: 10/573,895

(22) PCT Filed: Nov. 7, 2003

(86) PCT No.: PCT/EP03/12469

§ 371 (c)(1),
(2), (4) Date: Apr. 24, 2007

(87) PCT Pub. No.: WO2005/041372

PCT Pub. Date: May 6, 2005

(65) Prior Publication Data

US 2007/0268939 A1      Nov. 22, 2007

(30) Foreign Application Priority Data

Sep. 30, 2003   (EP) ................... PCT/EP03/10856

(51) Int. Cl.
*H01S 3/10* (2006.01)
(52) U.S. Cl. ........................................... 372/20
(58) Field of Classification Search .......... 372/20, 372/38.01, 38.02, 18, 37
See application file for complete search history.

(56) References Cited

U.S. PATENT DOCUMENTS 6,205,159 B1    3/2001    Sesko et al.

(Continued)

FOREIGN PATENT DOCUMENTS

GB    GB 2 357 589    6/2001

OTHER PUBLICATIONS

Patel et al., "Frequency Locking of a Tunable Liquid-Crystal Filter", Journal of Applied Physics, vol. 71, No. 5, pp. 2464-2466, (1992).

*Primary Examiner*—Armando Rodriguez
*Assistant Examiner*—Patrick Stafford
(74) *Attorney, Agent, or Firm*—Finnegan, Henderson, Farabow, Garrett & Dunner, L.L.P.

(57) ABSTRACT

A method of controlling an external-cavity tuneable laser which has a wavelength-elective tuneable mirror, in which wavelength selectivity is achieved by an electrical signal provided by an alternating voltage. The tuneable mirror has a liquid crystal material, a diffraction grating and a planar waveguide optically interacting with the grating. The diffraction grating and the waveguide form a resonant structure that reflects only a selected resonance wavelength from among all the other wavelengths impinging thereon. Depending on the amplitude of the voltage applied to the tunable mirror, the tuneable mirror reflects radiation only at a given wavelength. The lasing output wavelength of the laser is selected to correspond to the resonance wavelength of the tuneable mirror. Accurate selection of the emission wavelength (frequency) of the tuneable laser by the tuneable mirror can be derived from the analysis of the signal modulation induced by the AC voltage applied to the tuneable mirror.

11 Claims, 12 Drawing Sheets

U.S. PATENT DOCUMENTS

| | | |
|---|---|---|
| 6,215,928 B1 * | 4/2001 | Friesem et al. ................ 385/37 |
| 6,366,592 B1 | 4/2002 | Flanders |
| 6,526,071 B1 | 2/2003 | Zorabedian et al. |
| 6,717,965 B2 | 4/2004 | Hopkins, II et al. |
| 2002/0054614 A1 | 5/2002 | Jin |
| 2003/0007522 A1 | 1/2003 | Li et al. |
| 2003/0007526 A1 * | 1/2003 | Pontis et al. ............. 372/38.02 |
| 2003/0012239 A1 | 1/2003 | Daiber et al. |
| 2003/0142702 A1 | 7/2003 | Pontis et al. |

* cited by examiner

WAVELENGTH CONTROL OF AN EXTERNAL-CAVITY TUNEABLE LASER

CROSS REFERENCE TO RELATED APPLICATIONS

This application is a national phase application based on PCT/EP2003/012469, filed Nov. 7, 2003, the content of which is incorporated herein by reference, and claims priority of PCT/EP03/10856, filed Sep. 30, 2003, the content of which is incorporated herein by reference.

The invention concerns an external-cavity tuneable laser especially adapted for wavelength-division multiplexed optical communication networks. In particular, the invention relates to a method of selecting and controlling the position of a tuneable element in an external-cavity tuneable laser.

RELATED ART

The use of lasers as tuneable light source can greatly improve the reconfigurability of wavelength-division multiplexed (WDM) systems or of the newly evolved dense WDM (DWDM). For example, different channels can be assigned to a node by simply tuning the wavelength. Also, tuneable lasers can be used to form virtual private networks based on wavelength routing, i.e., photonic networks.

Different approaches can be used to provide tunable lasers, distributed Bragg reflector lasers, VCSEL lasers with a mobile top mirror, or external-cavity diode lasers. External-cavity tunable lasers offer several advantages, such as high output power, wide tuning range, good side mode suppression and narrow linewidth. Various laser tuning mechanisms have been developed to provide external-cavity wavelength selection, such as mechanically adjustable or electrically activated intracavity selector elements.

U.S. Pat. No. 6,526,071 describes an external-cavity tunable laser that can be utilized in telecom applications to generate the centre wavelengths for any channel on the International Telecommunications Union (ITU) grid. The disclosed tunable laser includes a gain medium, a grid generator and a channel selector, both grid generator and channel selector being located in the optical path of the beam. The grid generator selects periodic longitudinal modes of the cavity at intervals corresponding to the channel spacing and rejects neighbouring modes. The channel selector selects a channel within the wavelength grid and rejects other channels.

In order to accommodate increasing optical communication traffic, DWDM systems with channel spacing of 50 GHz and eventually of 25 GHz are under development. DWDM systems with 50 GHz channel spacing typically require frequency accuracy of ±2.5 GHz, whereas systems with 25 GHz generally require an accuracy of ±1.25 GHz. As DWDM uses narrower channel spacing, accuracy and control in the positioning of the tunable elements associated with the transmitter lasers over the entire tuning and operating temperature range has become an important issue. Non optimal positioning of tunable elements results in spatial losses and reduced output power of the transmitter. A reliable wavelength monitoring scheme to rapidly and correctly set and keep the desired operating wavelength is therefore desirable in assembly and operation of tunable elements associated to tunable lasers.

Active control systems of the laser wavelength and of other output parameters are generally implemented in external-cavity tunable laser systems. Often, these active control systems rely on locking the laser wavelength to the desired operating wavelength. Common locking techniques can use a feedback signal to maintain the wavelength centred to the desired value, either through current or temperature feedback. Wavelength locking systems can be present as external support circuitry or be integrated in the laser module.

U.S. Pat. No. 6,366,592 describes a tuneable laser including a tuneable Fabry-Perot (FP) cavity and a cavity length modulator, which controls the optical length of the cavity. The FP cavity is first tuned to the desired wavelength of operation, then the cavity length modulator is driven to vary the physical length of the laser cavity by an amount that is typically less than one wavelength of light at the operational wavelength. Fine intercavity mode tuning is achieved by reference to the absolute wavelength as detected by a wavelength locker. Alternatively, the cavity length is adjusted until the output power is maximized, which will occur when the cavity mode is centred at the centre wavelength of the FP filter. The solution described in the patent is said to be mostly applicable to tuneable laser having short laser cavities, preferably less than 3 cm, in a preferred embodiment less than 1 cm.

Inventors have noted that discrete wavelength selection of an intracavity element which is continuously tuneable can limit the accuracy of wavelength tuning and makes the use of a wavelength locking system necessary to maintain the wavelength to the desired operating value. They have further remarked that the use of a wavelength locking system, also if integrated, increases the cost of the laser module and may be prejudicial to the compactness of the laser system.

U.S. patent application No. 2003/0012239 describes a method for controlling a laser cavity by monitoring the voltage across the gain medium and adjusting a loss characteristic according to the monitored voltage. An electro-optic tuning element provides a frequency modulation signal or dither to the external cavity and a mechanism to tune the external cavity optical path length by the voltage applied across the tuning element.

Inventors have noted that monitoring the voltage across the gain medium to probe external cavity losses is not a direct measurement of the behaviour of the optical characteristics of the laser, which may be influenced by other factors independent from the optical signals.

U.S. patent application No. 2003/0007522 discloses an external cavity laser comprising a wavelength selector tuner and an external cavity tuner, wherein the wavelength tuner is uncoupled from the external cavity tuner. Modulation of the optical path length of the external cavity via frequency dither can be introduced to produce intensity variations in the output power of the cavity to evaluate the external cavity losses.

A laser system including a controller for monitoring various functions of a laser assembly is described in U.S. patent application No. 2003/0007526. The laser controller may include a wavelength tuning circuit for adjusting or locking the wavelength of the external cavity. The tuning circuit may include a modulation signal generator for providing a modulation signal to a selected transmission element that causes a corresponding modulation of the optical path of the laser external cavity.

Inventors have noted that adjusting the cavity length to bring the wavelength to a local maximum of the transmission spectrum of the grid etalon involves mechanical movements of at least an element of the laser cavity, e.g., the end mirror, which may affect the reliability of the laser system.

A number of liquid crystal (LC) devices have been developed as electronically tuneable spectral filters for wavelength selection in lasers and other WDM system components.

LC filters are often driven by an alternating current (AC) voltage to prevent degradation of the liquid crystal because of electrochemical effects. In "*Frequency locking of a tunable*

*liquid-crystal filter*", published in Journal of Applied Physics, vol. 71 (1992), pages 2464-66, a technique for frequency locking of a tuneable LC Fabry-Perot (FP) filter used for DWDM systems is described. The AC voltage at frequency ω, which is applied to the LC-FP filter to control the resonance of the filter, causes a small modulation at 2ω in the transmitted light intensity. To compensate for temperature fluctuations, frequency tracking of the FP filter is performed by a feedback system that minimizes the derivative signal resulting from the 2ω signal.

U.S. Pat. No. 6,205,159 discloses an external-cavity semiconductor laser that tunes to a discrete set of wavelengths by changing the voltage to a LC-FP interferometer. The discrete set of wavelengths one may tune to is defined by a static intracavity etalon. To couple the phase of the external cavity mode to the static etalon transmission, the optical path length is adjusted so that it equals a multiple half-wavelength of the transmission wavelengths selected by the static etalon. This may be accomplished by using a LC phase modulator to adjust the optical path length or mechanically change the cavity length with a piezo-electric transducer.

Inventors have noted that frequency modulation of the applied voltage induces variations of the refractive index of an LC material. Phase changes are proportional to the thickness of LC material that is traversed by the optical beam. In case of a FP filter, the optical beam undergoes multiple reflections as it traverses the FP filter, in other words it passes through the LC material many times, normally tens or hundreds of times. The multiple passage of the optical beam induces relatively high phase changes, which in turn increase the ripple of the modulated signal. Inventors have noticed that, for applications to single-mode tuneable lasers, relatively high phase changes cause a relatively large wavelength oscillation and intensity variation, which may cause instability of the laser output signal and/or broadening of the spectral linewidth.

Wavelength selection and tuning of a laser cavity can be performed by using an active tuneable mirror. An electro-optically controlled element employing LC and which can be used as an active tunable mirror is disclosed in U.S. Pat. No. 6,215,928. The lasing wavelength of the laser is determined by the active tunable mirror to be the resonance wavelength of the mirror. The resonant wavelength may be shifted by varying the voltage or current supplied to the electro-optically controlled element.

SUMMARY OF THE INVENTION

The present invention relates to a method of controlling an external-cavity tunable laser that comprises a wavelength-selective tuneable mirror, in which wavelength selectivity is achieved by an electrical signal. The electrical signal provided for the functioning of the tuneable mirror is an alternating voltage. The tuneable mirror of the present invention comprises an electro-optically tuneable material, preferably a liquid crystal (LC) material, a diffraction grating and a planar waveguide optically interacting with the grating. The diffraction grating and the waveguide form a resonant structure that reflects only a selected resonance wavelength from among all the other wavelengths impinging thereon.

Depending on the amplitude of the voltage applied to the tunable mirror, $V_{TM}$, the tuneable mirror reflects radiation only at a given wavelength $\lambda_{TM}$. The spectral response of the tuneable mirror is generally a curve, with a shape similar for example to that of a Lorentzian curve, centred at $\lambda_{TM}$ and characterized, inter alia, by the bandwidth at FWHM. The tuneable mirror is driven with an alternating voltage of amplitude $V_{TM}$ and frequency $f_A$ to prevent deterioration of the liquid crystal due to dc stress.

The lasing output wavelength of the laser is selected to correspond to the resonance wavelength $\lambda_{TM}$ of the tuneable mirror.

Inventors have found that accurate selection of the emission wavelength (frequency) of the tuneable laser by the tuneable mirror can be derived from the analysis of the signal modulation induced by the AC voltage applied to the tuneable mirror. Inventors have observed that wavelength misalignment is related to the modulation depth of the modulated signal, the wavelength alignment condition corresponding to the minimum of the modulation depth.

Frequency modulation of the applied voltage induces variations of the refractive index of the LC material which in turn induces a phase shift of the optical beam that has interacted with the LC material. To a first approximation, phase shifts are proportional to the thickness of LC material that is traversed by the optical beam. In single-mode tuneable lasers, relatively high phase shifts induce relatively large frequency modulations of the laser output signal. This effect is particularly detrimental if a spectrally selective loss element, such as a grid etalon, is present in the laser cavity, because it increases the amplitude modulation of the laser output signal.

In order to understand the effect of a tuneable mirror comprising a tuneable material and operating with an alternating voltage, a tuneable laser configured to emit a single longitudinal mode having a spectral linewidth at FWHM of 50 kHz is considered. The alternating voltage applied the tuneable mirror induces an oscillation of the central wavelength, $\lambda_{TM}$, of the spectral response of the tuneable mirror. This oscillation induces an amplitude modulation of the emission spectral line of the laser. The phase shifts due to the interaction with the LC material cause frequency modulations of the laser spectral line, i.e., the longitudinal mode oscillates back and forth so that the resulting effect is a broadened spectral line, e.g., of the order of 100 MHz or more. Although not discussed here, contributions to the phase shift of the spectral line may arise also from the other optical elements included in the laser cavity.

Inventors have understood that in case of a tuneable mirror comprising a grating, a waveguide and a LC material phase shifts caused by the alternating voltage remain relatively low. This is particularly true if light incidence is such that the light beam impinges first on the grating and then on the LC material. In this case, the incident beam interacts only with a first thin layer of the LC film before being reflected by the grating, very likely only 10-20% of the total thickness of the LC material is traversed by the beam. Also in case of light beam incidence such that the light passes through the LC before impinging on the grating, the light beam traverses the LC at most twice before exiting the mirror, i.e., does not undergo multiple reflections, as for instance in the case of Fabry-Perot LC filter.

It follows that the phase changes and intensity variations of the reflected signal, which are induced by the applied AC voltage, are relatively low, because of the relatively small thickness of the LC material interacting with the incident beam.

The thickness of the LC material is preferably not larger than about 2 μm, more preferably of about 1 μm.

In a preferred embodiment, the tuneable mirror has a variation of the refractive index of 0.2 for a wavelength tuning range (mirror tunability) of 45 nm, for instance varies from 1.6 to 1.8 for voltage amplitudes ranging from 0 V to 5 V applied on the LC material. The bandwidth at FWHM of the spectral response of the tuneable mirror is of 100 GHz. In a laser having cavity mode spacing of 3.5 GHz, the spectral linewidth of the laser was measured to be about 100 MHz, which corresponds to a phase shift of about 0.18 rad.

For comparison, inventors have considered a FP filter having the same bandwidth at FWHM of 100 GHz and the same tuning range of 45 nm. The FP filter comprises two reflecting mirrors facing one another and separated gap filled with a LC material having a refractive index variation of 0.05 in the tuning range. In order to have similar spectral characteristics as those of the tuneable mirror of the above described preferred embodiment, reflectivity of the mirrors is of 98.2% and the LC thickness is of 5 μm. The light beam undergoes at least a hundred reflections as it traverses the FP filter. Simulations have shown that the resulting phase shift of the transmitted light beam is of 0.8 rad, which corresponds, in a laser having cavity mode spacing of 3.5 GHz, to a broadening of the laser spectral linewidth of about 400 MHz, a value four times higher than that induced by the tuneable mirror with a LC and having similar spectral characteristics.

Inventors have noted that modulation depth exhibits a fair dependence on the magnitude of $V_{TM}$, and thus modulation depth slightly changes for different channels. At larger values of amplitude of the applied voltage the refractive index variations in the LC material become more pronounced.

In one of its aspects, the inventions relates to method, for example implemented by a control algorithm, which controls that the modulation depth of the laser output signal is not larger than about ±2% in all the laser tuning range, e.g., from 1530 to 1565 nm. Preferably, the modulation depth is controlled to be not larger than about 1%.

Different set-ups of the optical feedback and the modulated signal analysis will be presented. In a preferred embodiment, aligning of the resonance wavelength of the tuneable mirror to the lasing wavelength can be carried out concurrently with monitoring of laser output stability, e.g., output power stability.

In a further preferred embodiment, the modulated component of the optical power at the laser output is analyzed in order to align the resonance wavelength of the tuneable mirror to a selected cavity mode, e.g., by means of a photodiode placed at the laser output. Preferably, alignment of the resonance wavelength is carried out by slightly changing the amplitude of the voltage applied to the tuneable mirror.

Analysis of the modulated component of the laser output power can be performed together (or sequentially) with the analysis of the output power (the total output signal that comprises also the modulated component) in order to centre the cavity mode with a spectrally selective loss element, such as a grid etalon. In a preferred embodiment the loss element is grid etalon that defines a plurality of pass bands substantially aligned to corresponding channels of a wavelength grid. Centering of the cavity mode to a pass band of the spectrally selective loss element, i.e., mode stabilization of the laser output signal, can be attained by maximizing the laser output power. Measurements of the modulated component and of the "total" output power can be advantageously carried out by means of the same photodiode placed at the laser output.

The use of a tuneable mirror as channel selector can advantageously allow a relatively short laser cavity, because fewer elements are necessary within the laser cavity. A short laser cavity can be preferred for size constraints when the laser system is assembled in a standard package, e.g., a butterfly package. Furthermore, as it will become clear from the following discussion, a short cavity exhibits a better mode suppression of the modes transmitted through the etalon than a longer cavity. The suppression by the etalon of the cavity modes neighbouring the lasing mode will be hereafter referred to as the spectral etalon side suppression (ESS). Preferably, the tunable laser of the invention has a cavity length of not more than about 15 mm, more preferably not larger than about 12 mm. It is however to be understood that the present invention can be generalized to longer laser cavities.

Decreasing the laser cavity length leads to an increase in the spacing of the longitudinal cavity modes, i.e., the free spectral range of the laser cavity, hereafter referred to as $(FSR)_{cavity}$, owing to the relation $$(FSR)_{cavity} = \frac{c_0}{2\sum_i n_i L_i} \quad (1)$$

wherein $c_0$ is the speed of light in vacuo, $n_i$ (i=1, ..., m) is the refractive index of the medium filling the $i^{th}$-optical element that the light encounters in the cavity or of the cavity itself (i.e., the free space) and $L_i$ is the physical length of light path of the $i^{th}$ element. The optical path of the light in the laser cavity is referred to as the effective cavity length, $L_{eff}$, which is defined as $$L_{eff} = \sum_i n_i L_i. \quad (2)$$

The effective cavity length is of course related to the physical length of the external cavity, $L_0$. The laser external cavity can be thought of as an optical resonator composed of two confronting and reflective, generally parallel, surfaces separated by a length, which is defined as the physical length of the cavity, $L_0$. In general, $L_{eff} \geq L_0$.

It is possible to re-write Eq. (1) as $$(FSR)_{cavity} = \frac{c_0}{2L_{eff}} \quad (3)$$

For external-cavity lasers having $L_0$ smaller than 15 mm, $(FSR)_{cavity}$ is typically larger than about 8-10 GHz.

In one of its aspects, the invention relates to a tuneable laser module configured to emit output radiation on a single longitudinal mode at a laser emission wavelength, the laser module comprising an external cavity defining a plurality of cavity modes;

a gain medium to emit a light beam into the external cavity;

a tuneable mirror comprising a diffraction grating and a planar waveguide optically interacting with said diffraction grating, the diffraction grating and the planar waveguide forming a resonant structure, the tuneable mirror further comprising a light transmissive material having an index of refraction that varies in response to an electric field applied to the light transmissive material, making the tuneable mirror electrically tuneable in response to an alternating voltage of amplitude $V_{TM}$ and frequency $f_A$ so as to select a resonance wavelength $\lambda_{TM}$ and so as to modulate in amplitude the light beam reflected or transmitted by the tuneable mirror, and a controlling device apt to align the resonance wavelength $\lambda_{TM}$ of the tuneable mirror to at least one of the cavity modes by analyzing the modulated component of the light beam reflected or transmitted by the tuneable mirror.

DESCRIPTION OF THE PREFERRED EMBODIMENTS

Figure 1:
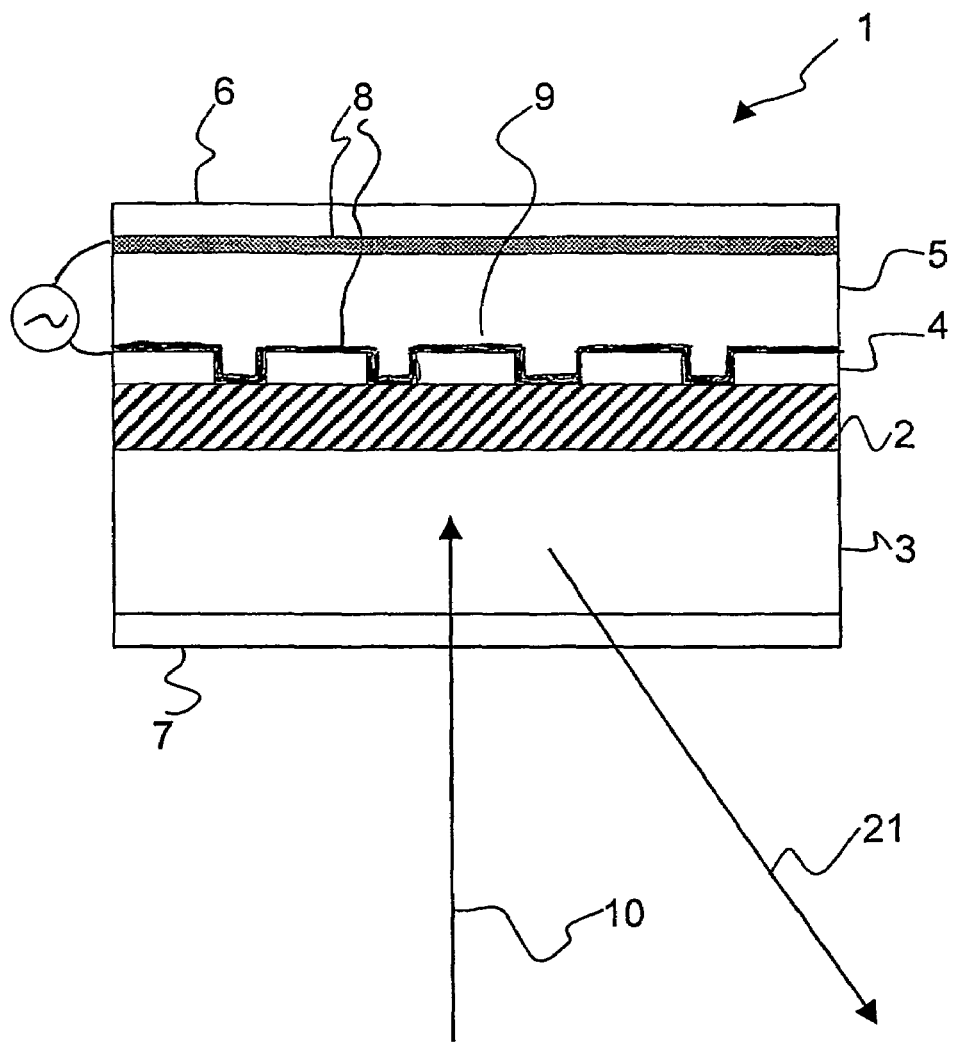
FIG. 1 is a simplified illustration of the tunable mirror according to a preferred embodiment of the invention.

The tuneable mirror is an electro-optic element, in which tunability is accomplished by using a material with voltage dependent refractive index, preferably a liquid crystal (LC) material. A preferred embodiment of the tunable mirror is shown in FIG. 1. Tunable mirror 1 comprises a waveguide 2 formed onto a substrate 3 and a diffraction grating 4 formed on waveguide 2. Over the diffraction grating 4 a cladding layer 5 that fills at least the interstices of the diffraction grating is formed, said cladding layer being made of a LC material. The thickness of the LC material is preferably not larger than 2 µm, more preferably of about 1 µm. Optionally, there may be an anti-reflection coating 6 over the cladding layer and/or an anti-reflection coating 7 on the surface of substrate 3, which is opposite to the waveguide. Two transparent conductors 8 and 9 are placed on opposite surfaces of the liquid crystal layer. A more detailed description of the structure of a tuneable mirror according to this preferred embodiment of the invention is given in U.S. Pat. No. 6,215,928.

An optical beam 10, e.g., the beam emitted by a gain medium (not shown), impinges on the tuneable mirror on the side of substrate 3, which is preferably made of silicon. The tuneable mirror then reflects a modulated beam 21, the modulation of the beam being caused by the applied AC voltage. It is to be understood that, although light beam incidence on the side of the substrate is preferred, light incidence can occur also on the opposite side of the mirror.

Depending on the voltage or current across the voltage applied to the conductors, the tuneable mirror reflects radiation only at a given wavelength ($\lambda_{TM}$). Radiation at all other wavelengths passes through the tuneable mirror. The tuneable mirror is placed at one of the laser cavity ends, i.e., forms one of the two reflective surfaces that define the length of the external cavity. Thus, the tuneable mirror functions both as wavelength-selective element and as cavity end mirror.

Figure 4A:
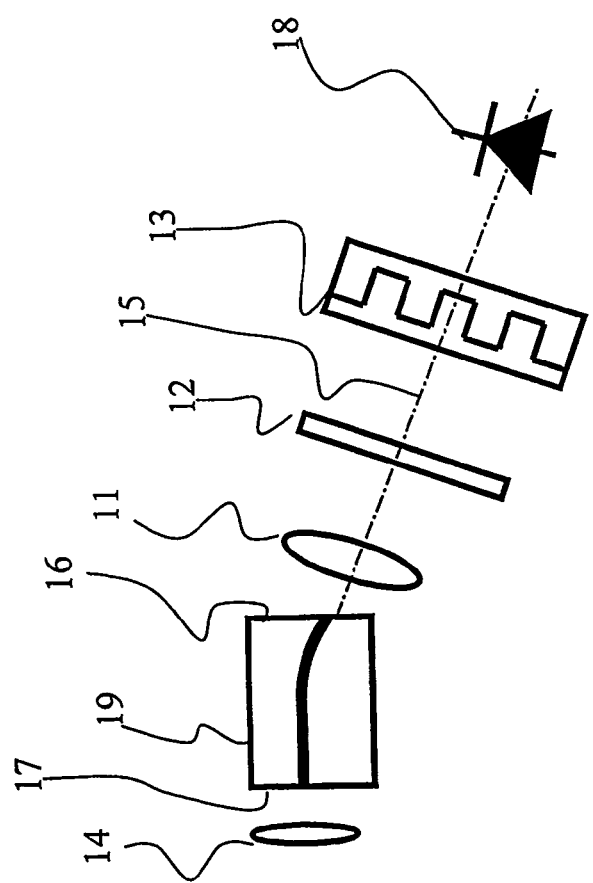
FIG. 4(a) is a schematic view of the tunable laser assembly according to a preferred embodiment of the invention.

A tuneable laser system according to a preferred embodiment of the present invention is schematically depicted in FIG. 4(a). The gain medium 19 is based on a semiconductor laser diode, for example an InGaAs/InP multiple quantum well FP gain chip especially designed for external-cavity laser applications. The diode comprises a front facet 17 and a back facet 16. The diode's back facet 16 is an intracavity facet and has an anti-reflection coating with a measured residual reflectance of the order of $10^{-4}/10^{-5}$. Preferably, the gain chip waveguide is bent so that it has an angled incidence on the back facet in order to further reduce back reflections. The front facet 17 is partially reflective and serves as one of the end mirrors of the external cavity. The reflectivity of the front facet is ranging between 5% and 30%. The emerging beam from the diode back facet is collimated by a collimating lens 11 that collimates the beam onto a spectrally selective loss element, in the present embodiment a FP etalon filter 12. In a preferred embodiment, the laser diode gain bandwidth is around 100 nm.

The laser can be designed in such a way that the operating wavelengths are aligned with the ITU channel grid. In this case, the laser wavelength is centred to the ITU grid via the FP etalon 12, which is structured and configured to define a plurality of transmission peaks. Transmission peak spacing, i.e., the free spectral range $(FSR)_{FP}$, which corresponds to the channel spacing, can be of e.g., 200 GHz, 100 GHz, 50 GHz or 25 GHz. The sharpness of the transmission peaks (or pass bands) is represented by the bandwidth at FWHM of the FP etalon, hereafter referred to as $(FWHM)_{FP}$, or by the finesse, which is the ratio of the etalon's FSR to the FWHM bandwidth.

Preferably, the FP etalon is placed in the cavity with a slight inclination angle to the perpendicular to the optical beam 15 in order to keep the reflected light of the FP etalon from returning to the laser diode. The inclination angle of the FP etalon is preferably comprised between 0.4° and 0.8°, more preferably of about 0.5°.

After the FP etalon 12, the beam strikes a tuneable mirror 13, which together with the first end mirror defines the cavity physical length, $L_0$. The tuneable mirror 13 reflects the light signal back to the gain medium, resulting in a resonant behaviour in the cavity between the tuneable mirror and the front facet 17 of the gain medium. In other words, the optical path from the back facet of the gain medium to the tuneable mirror forms a resonator that has a $(FSR)_{cavity}$ that depends inversely on the effective cavity length, $L_{\it eff}$, of the external cavity [Eq. (3)]. The laser beam is coupled out of the external cavity by the partially reflective front facet 17 of the gain medium. Optionally, a collimating lens 14 can be placed along the optical path of the laser output beam.

The laser assembly is designed to produce substantially single longitudinal and, preferably, transversal mode radiation. Longitudinal modes refer to the simultaneous lasing at several discrete frequencies within the laser cavity. Transversal modes correspond to the spatial variation in the beam intensity cross section in the transverse direction of the lasing radiation. Generally, an appropriate choice of the gain medium, e.g., a commercially available semiconductor laser diode including a waveguide, guarantees single spatial, or transversal, mode operation.

The laser is configured to emit an output radiation at a selected one of a plurality of equally spaced output frequencies that match the equally spaced channel frequencies in a WDM or DWDM system. The laser is operative to emit a single longitudinal mode output at wavelength $\lambda_{CM}$ (CM=cavity mode), which depends on the spectral response of the optical elements within the cavity and on the phase of the cavity.

For the laser effect to occur in the laser cavity, two conditions should be met: the condition for resonance and the condition for gain, which can be expressed, respectively, by the following equations $$2j\Phi_{LD} + 2j\Phi_{FS} + 2j\Phi_{FP} + j\Phi_{R2} = 2jN\pi \quad (4)$$

$$G_{LD}^2(\pi) G_{FP}^2(\lambda) \cdot R_1 \cdot R_2(\lambda) = 1 \quad (5)$$

where N is an integer number, $G_{LD}$ is the spectral gain of the laser diode, $\phi_{LD}$ is the phase delay introduced by the laser diode, $\phi_{FP}$ is the phase delay introduced by the FP etalon, $\phi_{FS}$ is the phase delay introduced by the free space, $G_{FP}$ is the transmission spectrum of the FP etalon, $R_1$ is the reflectivity of the front facet of the laser diode, $R_2(\lambda)$ is the reflectivity of the tuneable mirror, and $\phi_{R2}$ is the phase delay introduced by the tuneable mirror. The etalon phase delay $\phi_{FP}$ is related to the reflectivity of the etalon mirrors. It is known that the sharpness of the transmission, represented by the finesse, increases with the reflectivity of the mirrors of the etalon. Thus, $\phi_{FP}$ is related, through an appropriate function, to $(FWHM)_{FP}$. By combining (4) and (5) the following equation is obtained:

$$G_{LD}^2(\lambda) e^{2j\Phi_{LD}} \cdot e^{2j\Phi_{FS}} \cdot G_{FP}^2(\lambda) \cdot e^{2j\Phi_{FP}} \cdot R_1 \cdot R_2(\lambda) \cdot e^{j\Phi_{R2}} = e^{2jN\pi} \quad (6)$$

Inventors have noted that the FP etalon introduces the predominant contribution to phase non-linearity in the laser cavity in comparison to the contributions introduced by the other elements present in the cavity and by the cavity itself. The tuneable element selects one of the etalon peaks. The phase non-linearity of the selected etalon peak can thus be considered as the non-linearity of the FP etalon combined with that of the tuneable element.

Figure 2:
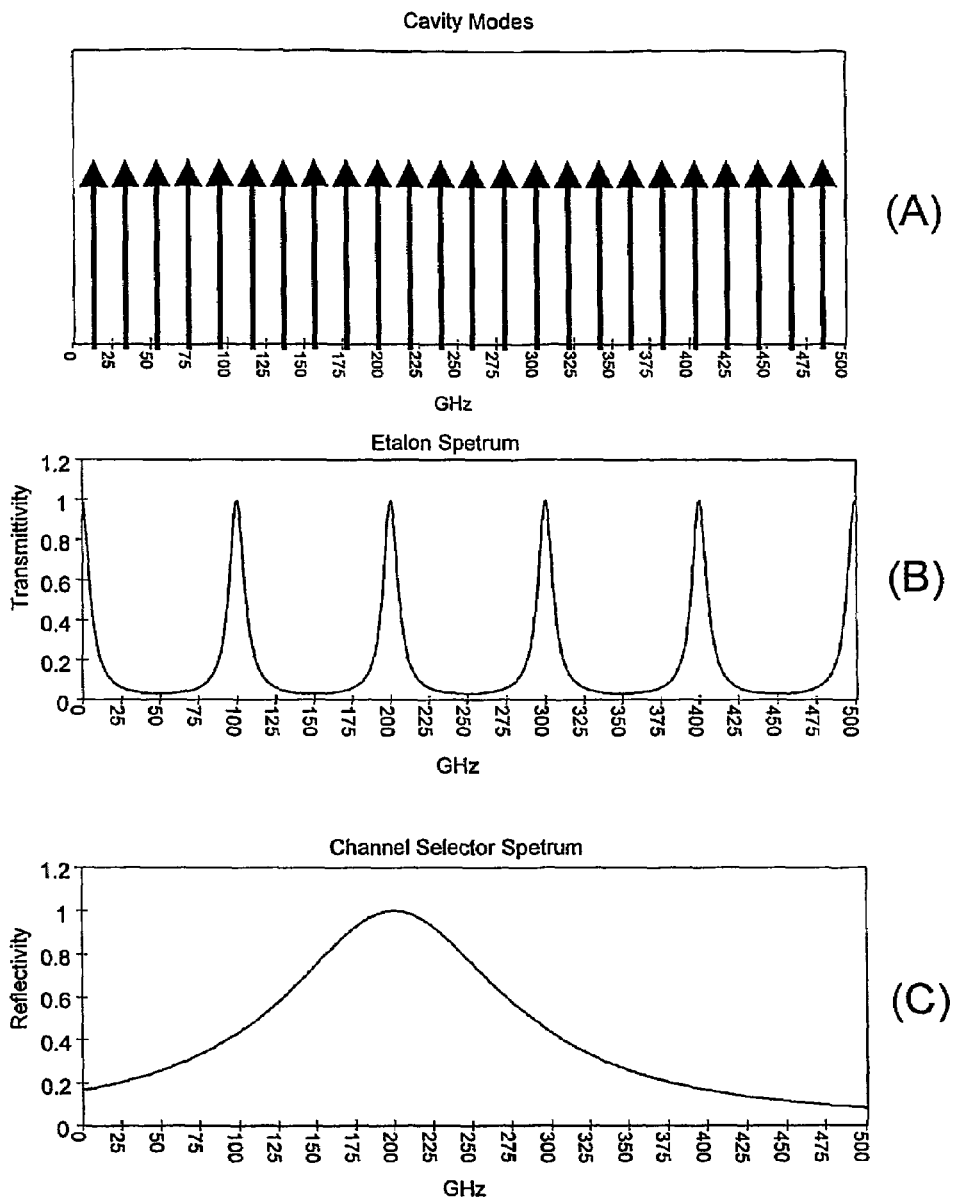
FIG. 2 is a graphical illustration of the external longitudinal cavity modes (A), of the transmission modes of the channel allocation grid (B), and of the bandwidth of the channel selector, i.e., the tunable element (C).

FIG. 2 is a diagram illustrating the various modes within a laser cavity comprising a Fabry-Perot (FP) etalon having a plurality of pass bands aligned to the ITU channel grid as spectrally selective loss element. In (A) the cavity modes induced by the resonant external cavity, i.e., mutually space by $(FSR)_{cavity}$, are shown; in (B) the modes of the FP etalon having the positions of the peaks locked to the standard ITU grid, and (C) is the pass band of the tuneable element, i.e., the tuneable mirror. In the illustrated example the FSR of the grid FP etalon, hereafter referred to as $(FSR)_{FP}$, corresponds to the spacing between the grid lines of the 100 GHz ITU grid.

Figure 3A:
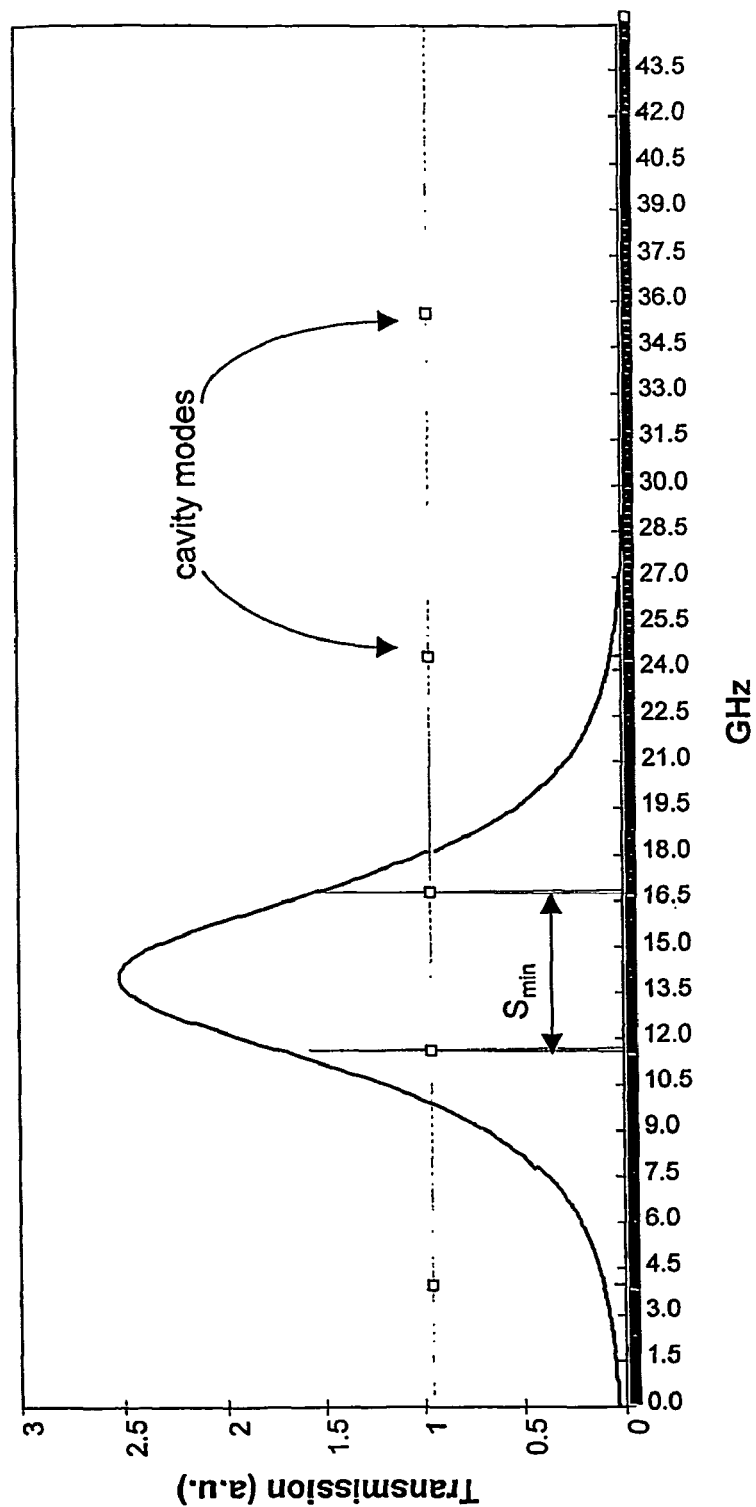
FIG. 3(a) is a graphical illustration of the longitudinal cavity modes within the pass band of the channel allocation grid selected by the tunable element when the laser oscillating condition is on mode hopping.

For a given "intrinsic" cavity mode spacing, $(FSR)_{cavity}$, the cavity mode spacing within the etalon transmission peaks, including the effect of the etalon phase non linearity, varies from a minimum mode spacing, $s_{min}$, to a maximum mode spacing, $s_{max}$. With reference to FIG. 3(a), $s_{min}$ corresponds to the condition wherein there are at least two cavity modes within an etalon transmission peak and the two modes that are adjacent to frequency $f_{FP}$ corresponding to the maximum of the (selected) etalon peak are substantially equidistant from said frequency $f_{FP}$. In this condition, there is no dominant frequency sufficient to provide the necessary coherence length, and longitudinal mode hopping may occur. Under mode hopping condition, the mode jumps between longitudinal cavity modes resulting in a sudden, discontinuous change in the laser output wavelength and power. The positions of the cavity modes outside and within the etalon peak are illustrated in FIG. 3(a) with open squares.

Figure 3B:
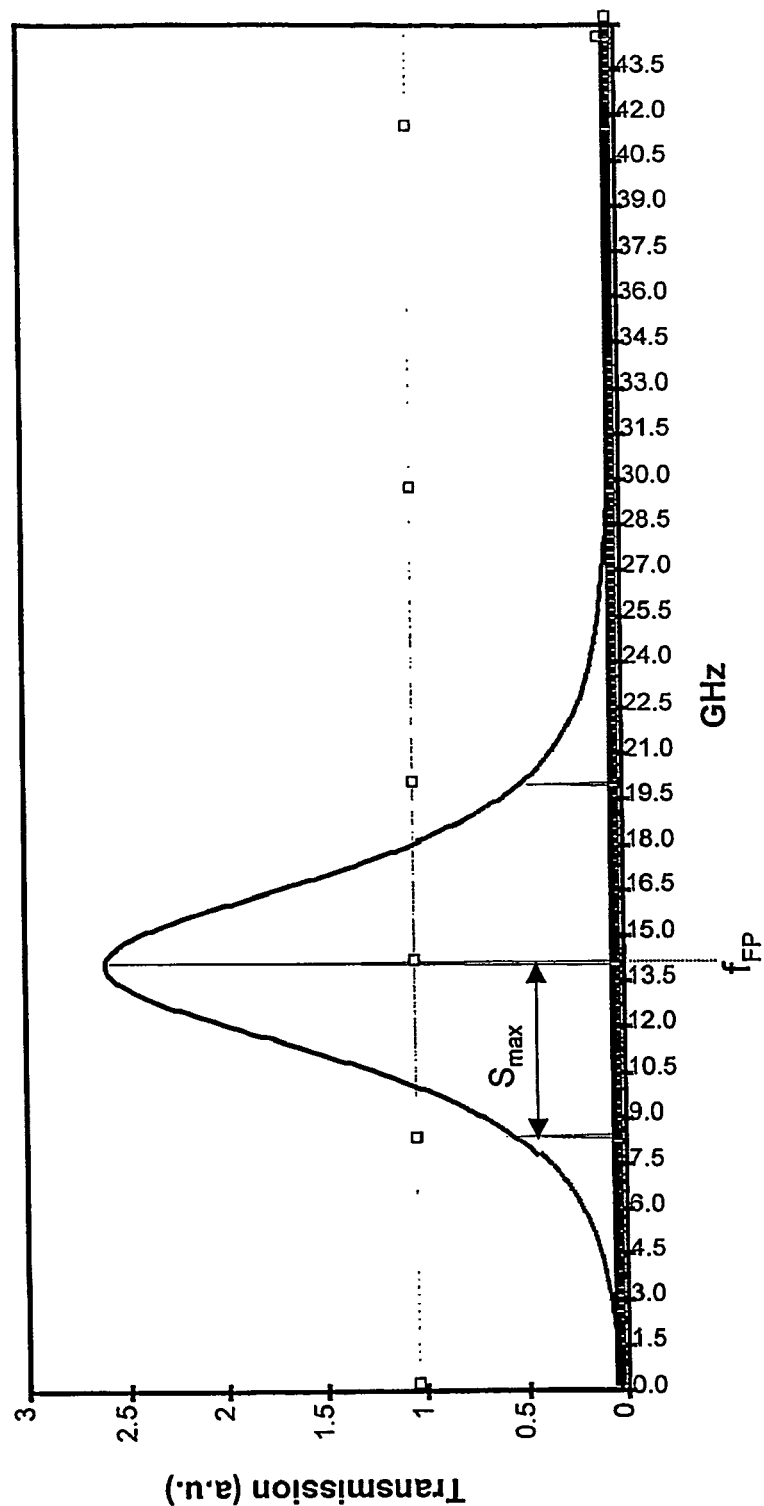
FIG. 3(b) is a graphical illustration of the longitudinal cavity modes within the pass band of the channel allocation grid selected by the tunable element on phase synchronism condition.

With reference to FIG. 3(b), $s_{max}$ corresponds to the condition where the frequency of one cavity mode substantially overlaps $f_{FP}$, corresponding to the optimal single-mode laser operation, i.e., stable lasing with (full) phase synchronism.

Inventors have observed that advantageous filtering characteristics of the grid etalon are related to the desired frequency (wavelength) accuracy one wants to obtain in the tuneable laser system. They have found that, for a given frequency accuracy, $\pm\Delta v$, $(FWHM)_{FP}$ should be selected such that the following relation is satisfied:

$$s_{min} \leq 2\Delta v \quad (7)$$

When the condition expressed by Eq. (7) is satisfied, phase quasi-synchronism of the laser cavity is attained.

Fulfilling the phase quasi-synchronism condition allows flexibility in the laser design, which can be for example tailored to the different customer requirements. According to the present invention, frequency accuracies in the laser output frequency down to about 0.5 GHz are achievable.

Inventors have noted a fairly weak dependence of the $s_{min}$ on the resolution bandwidth of the tuneable element, i.e., the tuneable mirror. Variations within 0.1-0.2 GHz in the $(FWHM)_{FP}$ have been found for FWHM of the tuneable element ranging from about 50 to 200 GHz.

By means of Eq. (6) it is possible to derive the value, or range of values, of the FP etalon phase delay, and thus of $(FWHM)_{FP}$, for a desired value of $s_{min}$. The desired value of $s_{min}$ is related to the required or desired frequency accuracy of the tuneable laser.

The FP etalon introduces a phase delay in the laser cavity, which induces a compression of the cavity modes, i.e., a reduction in the cavity mode spacing, in correspondence to the etalon transmission peaks. Referring to FIG. 3(a), $(FWHM)_{FP}$ is selected so as to obtain the desired values of $s_{min}$ by taking into account the effect of cavity mode compression. The values of $s_{min}$ are related to the required frequency accuracy of the laser, $\Delta v$, through Eq. (7).

Tables I and II report various values of $s_{min}$, $s_{max}$ and etalon side suppression (ESS) for different values of $(FWHM)_{FP}$ for $(FSR)_{FP} = 100$ GHz. Values were derived from numerical simulations of Eq. (6). Table I refers to a relatively long laser cavity, i.e., $L_0 = 25$ mm, and Table II refers to a relatively short laser cavity, i.e., $L_0 = 12.5$ mm. For both Table I and Table II, the FWHM bandwidth of the tuneable mirror, $(FWHM)_{TM}$, is of 100 GHz. Differences of 0.1-0.2 GHz in the values of $(FWHM)_{FP}$ were found for $(FWHM)_{TM}$ ranging from 50 to 200 GHz, indicating a weak dependence of $(FWHM)_{FP}$ on $(FWHM)_{TM}$ within the considered range.

TABLE I

| $L_0 = 25$ mm | $(FSR)_{cavity} = 5.3$ GHz | | $(FSR)_{FP} = 100$ GHz | |
|---|---|---|---|---|
| $(FWHM)_{FP}$ (GHz) | $(Finesse)_{FP}$ | $s_{min}$ (GHz) | $s_{max}$ (GHz) | ESS (dB) |
| 1.97 | 50.8 | 1.4 | 1.9 | 12.8 |
| 4.07 | 25.6 | 2.3 | 2.6 | 8.0 |
| 5.94 | 16.8 | 2.8 | 3.1 | 6.0 |

TABLE I-continued

| $L_0 = 25$ mm | $(FSR)_{cavity} = 5.3$ GHz | | $(FSR)_{FP} = 100$ GHz | |
|---|---|---|---|---|
| $(FWHM)_{FP}$ (GHz) | $(Finesse)_{FP}$ | $s_{min}$ (GHz) | $s_{max}$ (GHz) | ESS (dB) |
| 7.92 | 12.6 | 3.2 | 3.4 | 4.6 |
| 10.05 | 9.9 | 3.6 | 3.7 | 3.6 |

TABLE II

| $L_0 = 12.5$ mm | $(FSR)_{cavity} = 9.6$ GHz | | $(FSR)_{FP} = 100$ GHz | |
|---|---|---|---|---|
| $(FWHM)_{FP}$ (GHz) | $(Finesse)_{FP}$ | $s_{min}$ (GHz) | $s_{max}$ (GHz) | ESS (dB) |
| 1.97 | 50.8 | 1.6 | 2.8 | 19.8 |
| 4.07 | 25.6 | 2.9 | 3.9 | 13.8 |
| 5.94 | 16.8 | 3.7 | 4.7 | 10.9 |
| 7.92 | 12.6 | 4.5 | 5.3 | 8.9 |
| 10.05 | 9.9 | 5.2 | 5.9 | 7.4 |

As it is clear from Tables I and II, cavity mode compression increases with decreasing the value of $(FWHM)_{FP}$ and it is enhanced in case of shorter cavity lengths. For example, for $(FWHM)_{FP}$=4.07 GHz, minimum cavity mode spacing is reduced by about 57% in case of $L_0$=25 mm, whereas mode spacing reduction is of about 70% in case of $L_0$=12.5 mm. Furthermore, results reported in Tables I and II indicate that ESS is more pronounced in a shorter laser cavity, all other laser parameters being the same.

Therefore, relatively short cavity lengths have the advantage of having a relatively large ESS, i.e., a spectrally selective loss element, such as a FP etalon has a better spectral selectivity in shorter laser cavities. Preferably, cavity lengths should not be larger than about 15 mm to allow a laser design in which the grid element has a good spectral selectivity.

Tables III and IV report values of $(FWHM)_{FP}$, finesse and $s_{min}$ for a cavity length $L_0$=12.5 mm and $(FSR)_{FP}$ of 50 and 25 GHz, respectively.

TABLE III

| $L_0 = 12.5$ mm $(FSR)_{FP} = 50$ GHz | $(FSR)_{cavity} = 9.6$ GHz | |
|---|---|---|
| $(FWHM)_{FP}$ (GHz) | $(Finesse)_{FP}$ | $s_{min}$ (GHz) |
| 1.97 | 25.4 | 1.8 |
| 4.07 | 12.3 | 3.0 |
| 5.94 | 8.42 | 4.0 |
| 7.92 | 6.3 | 4.8 |
| 10.05 | 5.0 | 5.5 |

TABLE IV

| $L_0 = 12.5$ mm $(FSR)_{FP} = 25$ GHz | $(FSR)_{cavity} = 9.6$ GHz | |
|---|---|---|
| $(FWHM)_{FP}$ (GHz) | $(Finesse)_{FP}$ | $s_{min}$ (GHz) |
| 1.97 | 12.7 | 1.8 |
| 4.07 | 6.1 | 3.3 |
| 5.94 | 4.2 | 4.5 |
| 7.92 | 3.2 | 5.5 |
| 10.05 | 2.5 | 6.2 |

Results indicate that a lower $(FSR)_{FP}$ requires a slightly more selective, i.e., with narrower transmission bandwidths, etalon if a relatively high frequency accuracy is to be achieved.

Table V reports values of $(FWHM)_{FP}$ and $s_{min}$ for different values of $(FSR)_{FP}$ for a laser cavity of cavity length $L_0$=10 mm.

TABLE V

| $L_0 = 10$ mm | $(FSR)_{cavity} = 12$ GHZ | | |
|---|---|---|---|
| $(FSR)_{FP} =$ $(FWHM)_{FP}$ (GHz) | 25 GHz $s_{min}$ (GHz) | 50 GHz $s_{min}$ (GHz) | 100 GHz $s_{min}$ (GHz) |
| 1.97 | 1.9 | 1.8 | 1.7 |
| 4.07 | 3.6 | 3.2 | 3.0 |
| 5.94 | 5.0 | 4.3 | 4.0 |
| 7.92 | 6.2 | 5.3 | 4.9 |
| 10.05 | 7.1 | 6.2 | 5.7 |

As an example of possible relationship between $(FWHM)_{FP}$ and $s_{min}$, inventors have inferred from the examples reported in Tables I to V an approximately linear dependence between $(FWHM)_{FP}$ and $s_{min}$, which can be expressed by the following relation:

$$(FWHM)_{FP} = \alpha + \beta \cdot s_{min}. \quad (8)$$

For example, referring to data reported in Table V for $L_0$=10 mm and $(FSR)_{FP}$=100 GHz, $\alpha \approx -1.7$ GHz and $\beta \approx 2.0$. If the required $\Delta v$ is ±1.25 GHz and $s_{min} \approx 2\Delta v$ [from Eq.(7)], $(FWHM)_{FP} \approx 3.3$ GHz.

Referring back to the example reported in Table II, for $L_0$=12.5 mm, $(FSR)_{FP}$=100 GHz and $\Delta v$ is ±1.25 GHz, $(FWHM)_{FP} \approx 3.6$ GHz. Considering all the examples shown in Tables I to V, for a cavity length between 10 and 12.5 mm and a $(FSR)_{FP}$ ranging from 25 to 100 GHz, a frequency accuracy of ±1.25 GHz corresponds to a value of $(FWHM)_{FP}$ ranging from about 2.6 GHz to about 3.6 GHz.

The intercept on the $(FWHM)_{FP}$ axis and the slope depend on cavity length and on channel spacing, $\alpha = \alpha[(FSR)_{FP}, L_{eff}]$ and $\beta = \beta[(FSR)_{FP}, L_{eff}]$. For $L_0$ comprised between 7.5 and 15 mm and channel spacing comprised between 25 and 100 GHz, $\alpha$ ranges roughly from −0.8 to −2.7 GHz and $\beta$ ranges roughly from 1.2 to 2.6. Slope and intercept increase, in absolute value, with increasing channel spacing and with increasing $L_{eff}(L_0)$.

Inventors have found that, for an optical path length not larger than about 15 mm, phase quasi-synchronism is attained for values of $(FWHM)_{FP}$ not larger than about 8 GHz. Preferably, $(FWHM)_{FP}$ is not larger than 6 GHz.

The choice of the optimal $(FWHM)_{FP}$ should also take into account that optical losses in the laser cavity increase with the spectral selectivity of the etalon. In addition, with the decrease of the $(FWHM)_{FP}$, the optical power density in the etalon increases, leading to possible instabilities in the spectral response of the etalon caused by thermo-optical effects. These considerations set in practice a lower limit in the choice of the optimal value of $(FWHM)_{FP}$.

Figure 5:
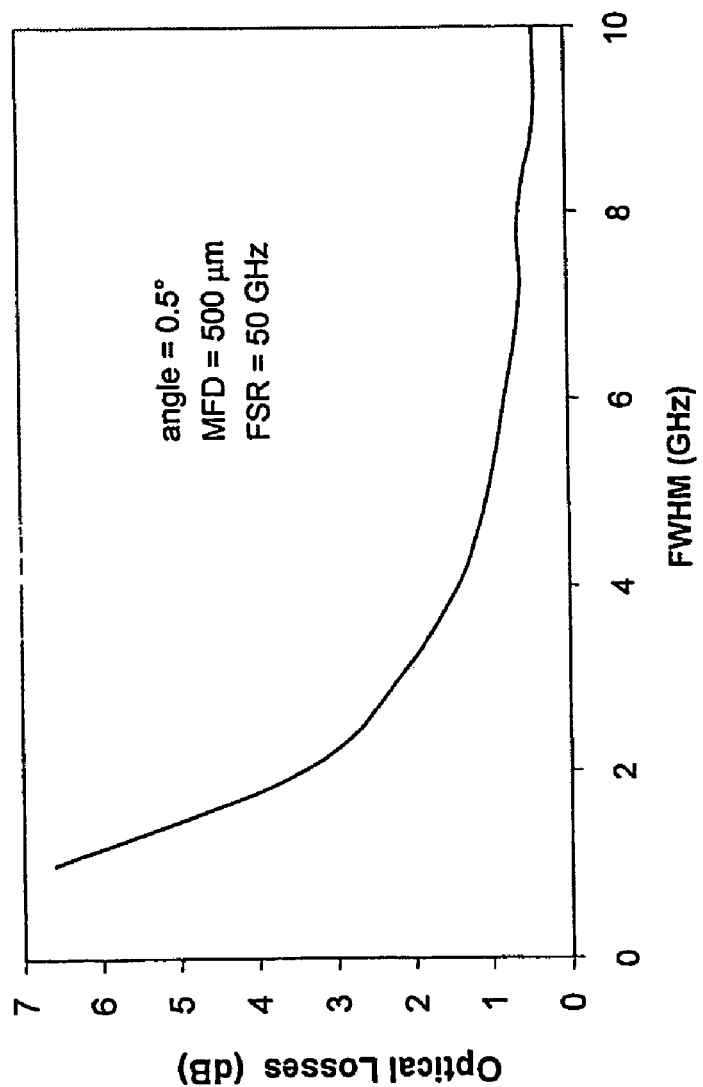
FIG. 5 is a diagram illustrating the optical losses of the laser cavity as a function of the bandwidth at FWHM of a FP etalon having a FSR of 50 GHz and being positioned in the cavity with an inclination angle to the perpendicular to the optical beam of 0.5°.

FIG. 5 shows an increasing optical loss with a decreasing $(FWHM)_{FP}$ for a FP etalon positioned at an inclination angle of 0.5° and having $(FSR)_{FP}$=50 GHz and beam mode field diameter (MFD) of 500 μm. For $(FWHM)_{FP}$ smaller than about 3 GHz, optical losses become larger than 2 dB, while for $(FWHM)_{FP}$ of 2 GHz, optical losses are larger than 3 dB.

The $(FWHM)_{FP}$ is then preferably larger than about 2 GHz, more preferably larger than about 3 GHz.

When the condition of passive phase quasi-synchronism of the lasing frequency is fulfilled, i.e., when the $(FWHM)_{FP}$ of the etalon is properly selected, it is possible to implement a closed-loop control that makes the laser to operate at the desired wavelength that corresponds to the etalon peak (the one selected by the tuneable mirror), thus to a local maximum in the laser output power.

The closed-loop control for aligning the lasing mode with the selected etalon peak can be carried out by for example adjusting the injection current of the gain medium, e.g., the laser diode. A change in the injection current of the laser diode induces a change in the refraction index of the gain medium and thus a variation in the phase of laser output. Small adjustments of the injection current of the laser diode can then be used to maximize the output power.

Figure 6:
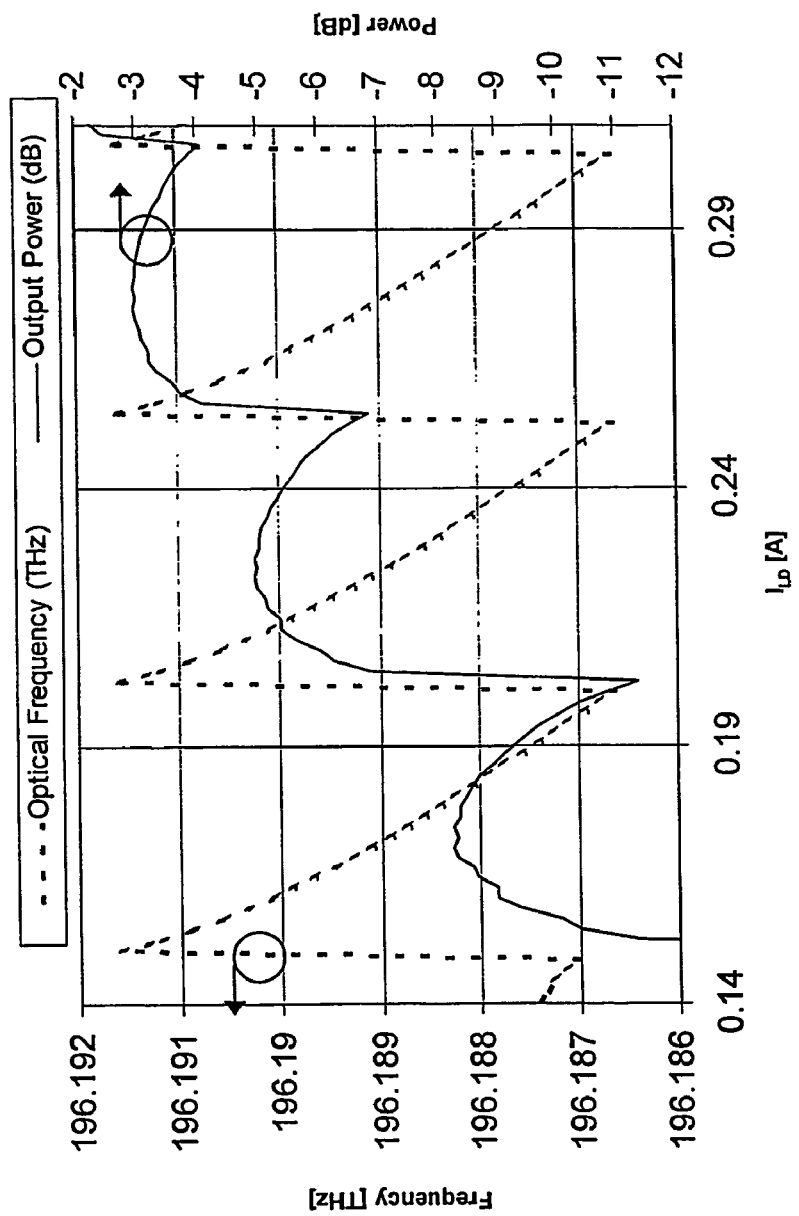
FIG. 6 is an exemplary measurement showing the laser output power (solid line) and the output optical frequency (dashed line) as a function of the injection current of the laser diode.

FIG. 6 shows the laser output power (solid line) as a function of the injection laser diode current, $I_{LD}$, for an exemplary tuneable laser according to the invention. At the local maxima of the output power alignment of the cavity mode with the (selected) etalon peak is obtained. Local minima correspond to the condition of mode hopping. FIG. 6 shows also the laser frequency dependency on $I_{LD}$ (dashed line). The difference between the maximum and the minimum frequency corresponds to the minimum distance between two adjacent cavity modes within the selected etalon peak, i.e., to $s_{min}$.

From FIG. 6 it can be seen that more than one stable operating condition for the laser can be achieved, the stable operating conditions corresponding to the peaks in the output power. The output power can be selected by varying the injection current so as to correspond to one of a series of discrete values, each power value about the local maxima being stable over time.

If the laser were to drift for some reason, e.g., caused by ageing or thermal effects, it would be sufficient to adjust only the injection current to correct the frequency, thus avoiding the occurrence of mode hopping by quickly and precisely centring the frequency.

The tuneable laser is turned on by switching on the laser diode with a certain injection current comprised in the range that guarantees single-mode operation. At any initial value of injection current within the single-mode operating range, the tuneable laser configuration allows a quick and accurate centring of the channel frequency, even considering possible current drifts due to ageing or thermal effects.

A simple algorithm that maximizes the laser output power can be implemented for fine tuning of the cavity mode under the peak of the etalon mode.

The tuneable mirror in the laser cavity serves as the coarse tuning element that discriminates between the peaks of the FP etalon. Accuracy and control in the positioning of the tuneable element with respect to the selected channel frequency is of great importance, especially when great laser frequency accuracies are required.

In the preferred embodiments, the tuneable element is a tuneable mirror. Referring back to FIG. 4(a), the structure of tuneable mirror 13 according to one of the preferred embodiments is illustrated in FIG. 1. The tuneable mirror is driven with an alternating voltage of amplitude $V_{TM}$ at a frequency $f_A$ to prevent deterioration of the liquid crystal due to dc stress. The frequency of the applied voltage may range from 20 kHz to 200 kHz. The spectral response of the tuneable mirror is a curve, with a shape for example similar to that of a Lorentzian curve, centred at $\lambda_{TM}$, having a (FWHM)$_{TM}$ bandwidth in the range from about 50 GHz to about 250 GHz. In a particular embodiment, the $\lambda_{TM}$ can be tuned over an 80 nm range.

In a preferred embodiment, impingement of the beam is substantially perpendicular to the waveguide surfaces of the tuneable mirror. An impinging beam with constant power at a wavelength $\lambda$ is reflected by the mirror when the incident wavelength $\lambda$ coincides or is close to $\lambda_{TM}$. The beam reflected by the tuneable mirror is modulated in amplitude with frequency $f_A$ and its associated higher-order harmonics $2f_A$, $3f_A$, ..., $nf_A$, because of the applied AC voltage.

Figure 7:
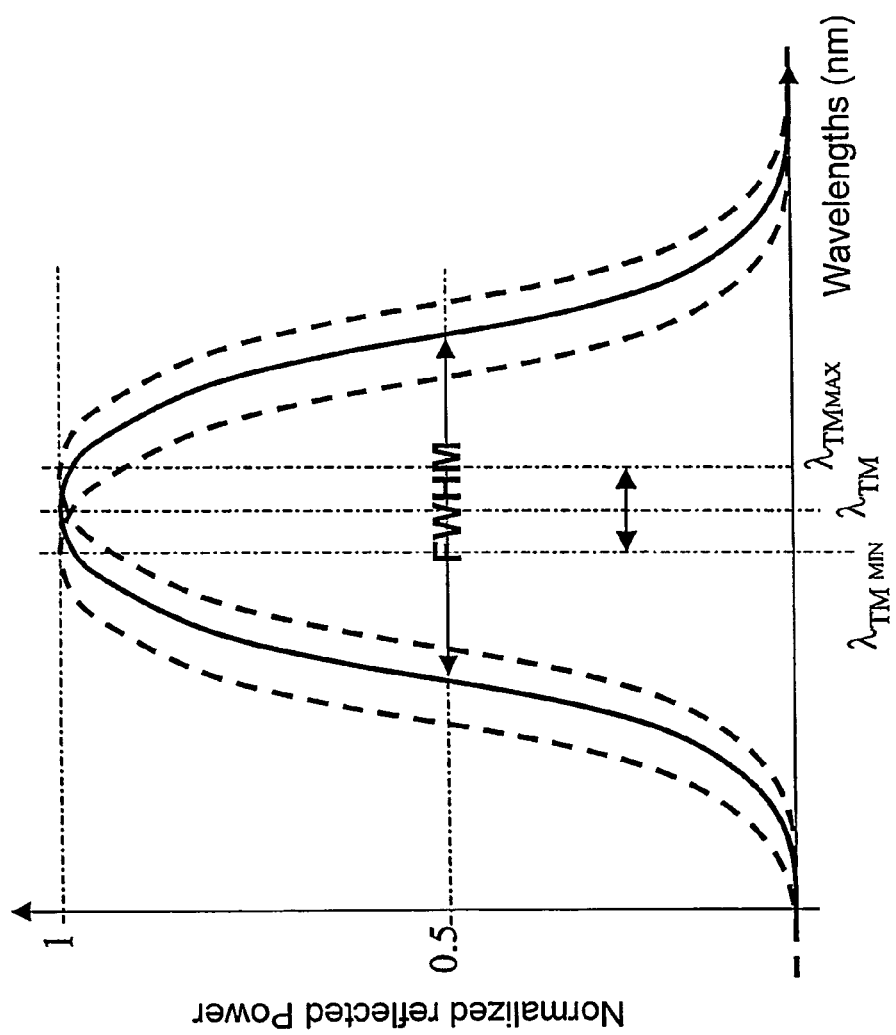
FIG. 7 is a diagram illustrating the spectral response of the tunable mirror, which exhibits an oscillation due to the AC applied voltage.
Figure 8:
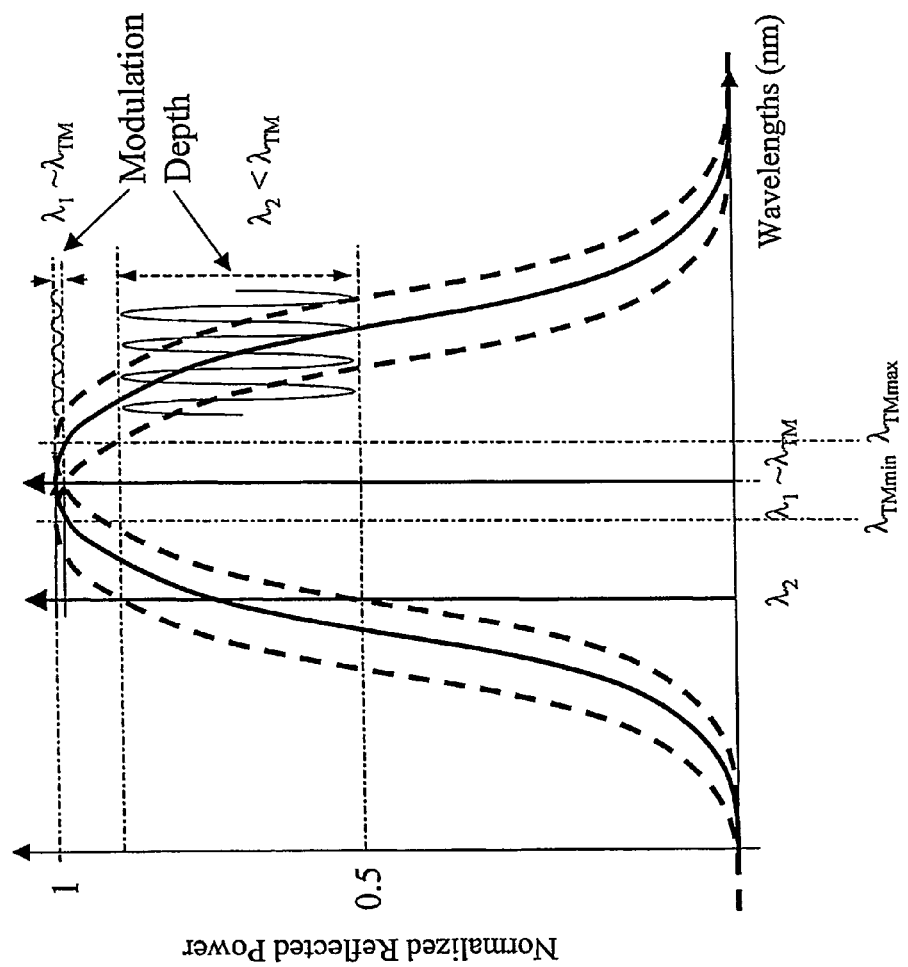
FIG. 8 is a diagram illustrating the spectral response of the tunable mirror, showing also the dependence of modulation depth on the incident wavelength.

The AC voltage induces an oscillation of the central wavelength $\lambda_{TM}$ of the spectral response of the tuneable mirror. FIG. 7 schematically illustrates the spectral response of the tuneable mirror by plotting the normalized reflected power as a function of wavelength, by assuming that the mirror spectral response has a Gaussian shape. The spectral curve oscillates with frequency $f_A$ between a peak value of $\lambda_{TMmin}$ and of $\lambda_{TMmax}$. In FIG. 7, solid line represents the curve centred at $\lambda_{TM}$, whereas the dashed lines represent the curves centred at $\lambda_{TMmin}$ and at $\lambda_{TMmax}$. This oscillation induces an amplitude modulation of the reflected beam, which depends on the position of the incident wavelength $\lambda$ with respect to $\lambda_{TM}$. FIG. 8 illustrates the effect of the modulation of the reflected beam for two incident beams, the first having a wavelength approximately equal to that of the tuneable mirror, i.e., $\lambda_1 \sim \lambda_{TM}$, and the second having a wavelength different from $\lambda_{TM}$, for example, $\lambda_2 < \lambda_{TM}$. For the impinging beam at $\lambda_1$, the oscillation of the spectral curve induces an amplitude modulation at frequency $f_A$ (and its higher-order harmonics) in the reflected beam, the modulation having a minimum modulation depth. In contrast, the oscillation of the spectral curve induces a modulation with a relatively larger modulation depth if the incident wavelength $\lambda_2$ differs substantially from $\lambda_{TM}$, the modulation depth being larger with increasing wavelength difference, in absolute value, $\Delta\lambda = |\lambda - \lambda_{TM}|$. Consequently, it is possible to derive the wavelength difference $\Delta\lambda$ from the spectral analysis of the modulated component of the reflected beam.

Modulation depths can range from about 0.1% to about 10%, for a range of frequencies $f_A$ between 20 and 200 kHz. Modulation depth is also a function of the voltage amplitude $V_{TM}$, the modulation being deeper with increasing voltage amplitude. Voltage amplitude may range from 3 V to 30 V RMS.

Large modulation depths correspond to the condition of misalignment of the tuneable mirror to the incident cavity mode, whereas minimum modulation depth corresponds to the (optimal) alignment condition.

Figure 4B:
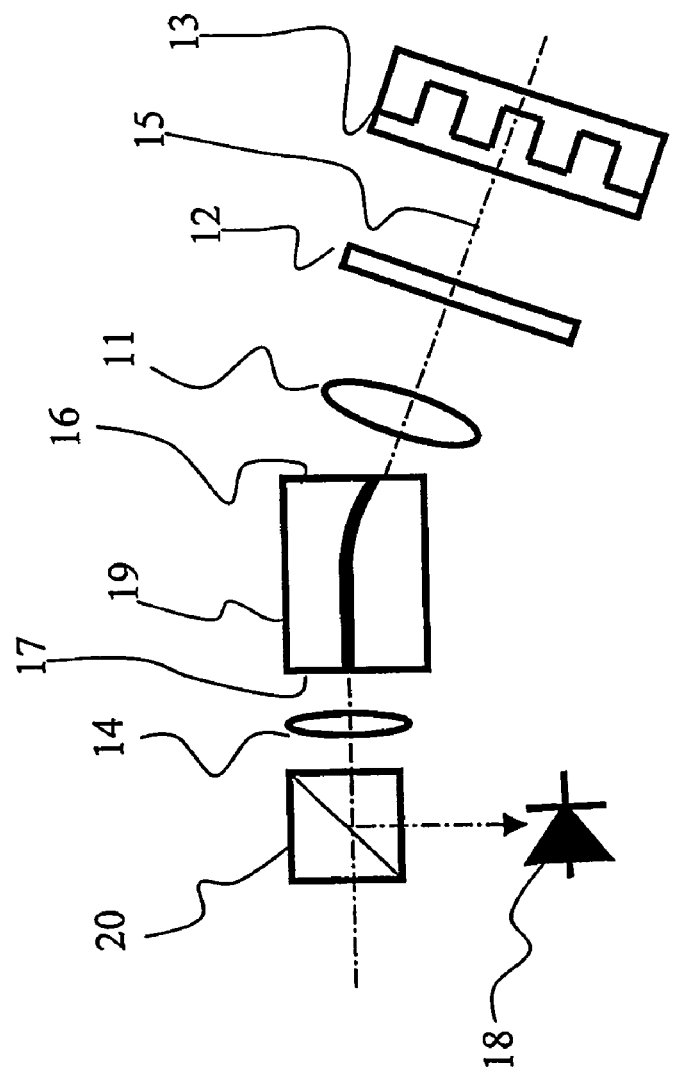
FIG. 4(b) is a schematic view of the tunable laser assembly according to another preferred embodiment of the invention.

One way of deriving $\Delta\lambda$, i.e., the degree of the centring of the incident wavelength with the resonant wavelength of the tuneable mirror, is by measuring the modulated component of the power of the reflected beam. It is preferable to measure the beam power externally to the cavity to reduce the optical elements in the laser cavity, which can be source of insertion losses or introduce a phase perturbation. Referring to FIG. 4(b), the photodetector 18 can be placed in front of the gain medium 10, at the laser output. According to this embodiment, the laser output beam is detected after being splitted by means of a beam-splitter 20, e.g., a 98%/2% tap.

Alternatively, the modulated component of the power transmitted through the tuneable mirror can be measured. Referring to FIG. 4(a), the tuneable mirror 13 has a typical reflectivity of 70%-95%, allowing a (small) portion of incident light to be transmitted. Obviously, the minimum of transmittance occurs at $\lambda_{TM}$. In the laser configuration illustrated in FIG. 4(a), a photodetector 18, e.g., a photodiode, is placed externally to the cavity to measure the light transmitted through the tuneable mirror.

In both configurations illustrated in FIGS. 4(a) and 4(b), the modulated component of the externally transmitted light, e.g., the AC transmitted power [FIG. 4(a)], or the AC laser output power [FIG. 4(b)], $P_f$, can be measured by means of the photodetector followed by or integrated with an electrical spectrum analyzer, e.g., an oscilloscope (not shown). For instance, a photodiode can be directly connected to the oscilloscope. It is to be understood that analysis of the modulated component(s) can be carried out by an electronic circuit connected to the photodiode, which may include an electronic filter that selects the modulation frequency of the AC voltage and optionally a pre-amplifier between the photodiode and the electronic filter.

Figure 9:
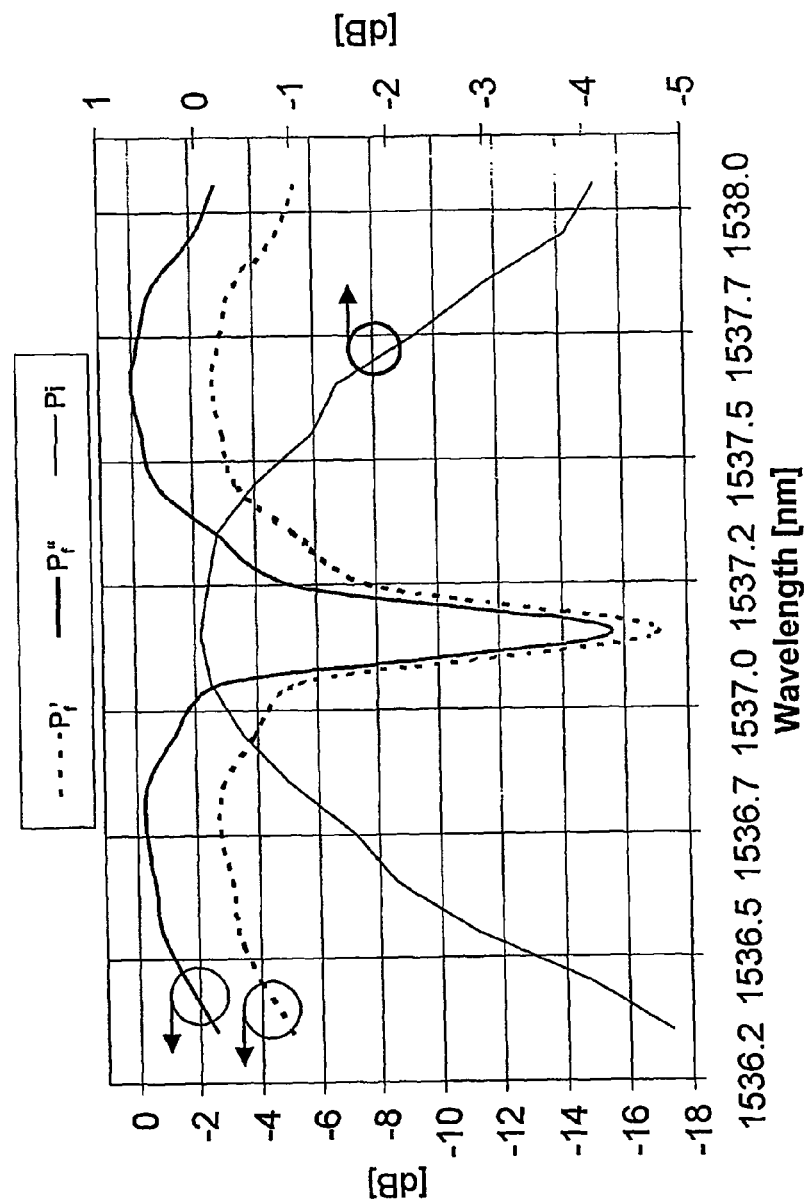
FIG. 9 is an exemplary measurement of the integrated laser output power as a function of wavelength (thin solid line) and of the AC components of the laser output power, at frequency $f_A$ (thick solid line) and at $2f_A$ (dashed line).

The transmitted or laser output power received by the photodetector 18 is a function of wavelength. Considering the configuration of FIG. 4(*b*), if the wavelength of the reflected beam changes, there is change in the reflected power. FIG. 9 shows an exemplary measurement of the reflected power vs. wavelength. Thin solid line represents the total measured power $P_i$, which is the spectral response of the tuneable mirror. The maximum of $P_i$ corresponds to the resonant wavelength $\lambda_{TM}$. Thick solid line represents the modulated component of the laser output power at frequency $f_A$, $P'_f$, exhibiting a sharp minimum in correspondence to the resonant wavelength. Modulated components of higher-order harmonics can be also measured. In FIG. 9, the modulated component at frequency $2f_A$, $P''_f$, is shown with a dashed line. FIG. 9 clearly shows that the modulated components of the laser output power are several orders of magnitude more sensitive to wavelength changes than the integrated power $P_i$. As both the output power and its modulated component depend on the input power, i.e., the power of the impinging beam, the ratio $P_i/P_f$ can be monitored for wavelength control.

The amplitude of the modulation of the beam reflected [FIG. 4(*b*)] or transmitted [FIG. 4(*a*)] by the tuneable mirror indicates the magnitude of the adjustment required for the alignment of the channel selector, i.e., the tuneable mirror, with the cavity modes. The phase of the modulation of the reflected or transmitted beam indicates the direction of the adjustment. Operatively, in the laser assembly, an AC component of the optical power at the laser output and its related phase are measured to evaluate the magnitude and the sign of the wavelength difference between the cavity mode wavelength $\lambda_{CM}$ and the peak wavelength of the tuneable mirror $\lambda_{TM}$, i.e., $\Delta\lambda = \lambda_{CM} - \lambda_{TM}$. In order to reduce or to cancel the wavelength difference $\Delta\lambda$, minimization of the AC component of the optical power is sought by changing the voltage $V_{TM}$ applied to the tuneable mirror. An electronic feedback loop can be implemented to this purpose.

The control algorithm for the alignment of the tuneable mirror ensures that the modulation depth of the laser output signal is not larger than about ±2% in the whole laser tuning range, e.g., in the C-band from 1530 to 1565 nm. In this way, broadening of the spectral linewidth of the laser output signal is not larger than about 100 MHz for emission wavelengths ranging from 1530 to 1565 nm.

The frequency of the modulation is selected low enough to avoid interference with the modulated carrier signal provided by the external cavity laser during transmission. Preferably, the modulation frequency is comprised in the range 20 kHz to 200 kHz.

With this system real-time signal monitoring can be carried out. Initial operation points for all channels on the ITU grid are stored in a look-up table. In the look-up table every channel is associated to a voltage amplitude $V_{TM}$ applied to the tuneable mirror, and thus to a selectable channel wavelength $\lambda_{TM}$.

Preferably, mode stabilization in the laser cavity is achieved by aligning the cavity mode at $\lambda_{CM}$ with the centre of the etalon's transmission peak at $\lambda_{FP}$. As described above, centring of the etalon peak with the cavity mode can be obtained by adjusting the injection current, $I_{LD}$, of the laser diode and monitoring the laser output power. The laser output power can be measured by means of a photodetector placed in front of the gain medium, at the laser output, as illustrated in the configuration of FIG. 4(*b*). The look-up table can store also the initial operative values of injection current, $I_{LD}$, which are associated to the channel frequencies.

In a preferred embodiment, monitoring of both the laser total power and one of its modulated components, for aligning both the cavity mode to the etalon peak and the tuneable mirror to the cavity mode, is carried out by means of a photodiode in the configuration shown in FIG. 4(*b*). To align the tuneable mirror to the selected cavity mode, the AC component of the output power is analyzed, whereas to align the cavity mode to the etalon peak maximization of the total output power is sought. Two control algorithms, which operate sequentially, can be implemented to this purpose.

It is to be noted that the two control algorithms can work independently of one another, for instance, the control algorithm to align the tunable mirror to the cavity mode works also if the condition of minimum loss, i.e., phase synchronism of the cavity mode, is not fulfilled.

Figure 10:
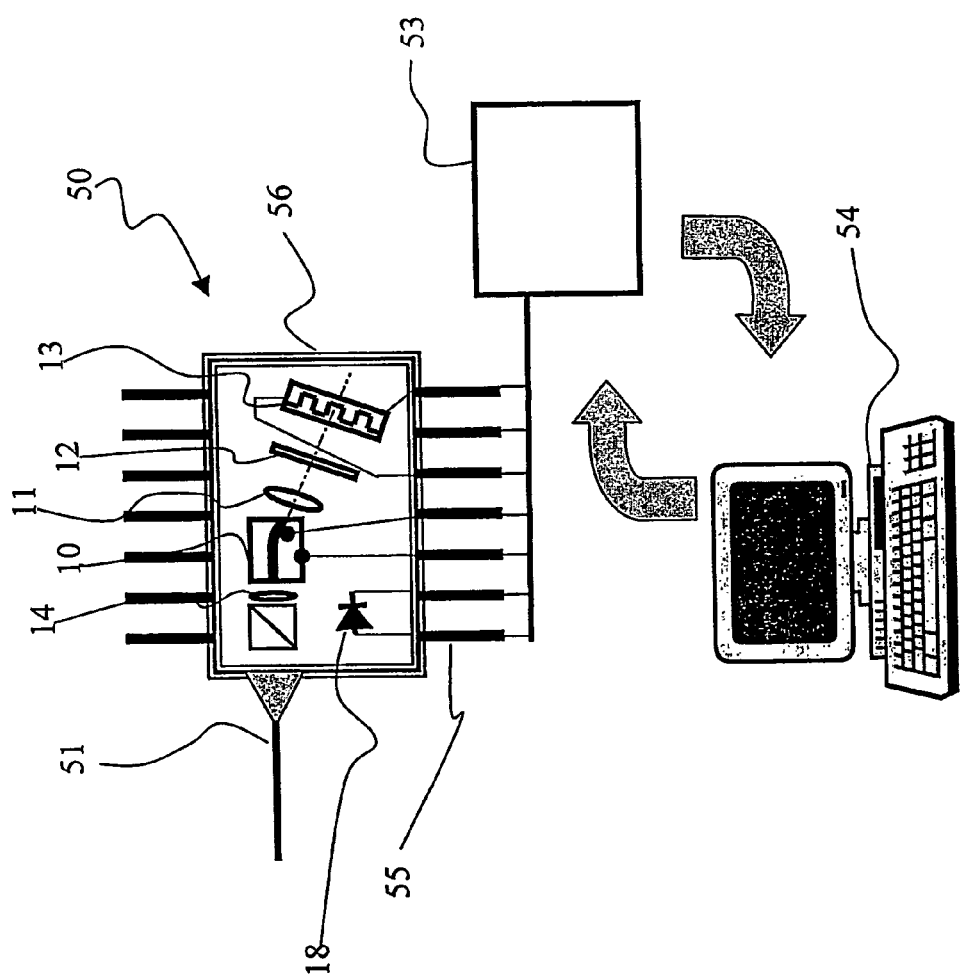
FIG. 10 is a schematic view of a control circuit for wavelength stabilization of a tuneable laser according to an embodiment of the invention.

FIG. 10 shows a schematic set-up of a control circuit for wavelength and mode stabilization of a laser system according to an embodiment of the present invention. The same reference numerals are given to elements of the tuneable laser corresponding to those shown in FIG. 4(*b*) and their detailed explanation is omitted. The laser assembly fits in a 14-pin butterfly package 56 with lead pins 55 and fibre pigtail 51. The package housing the laser assembly with the output connections, e.g., lead pins and/or fibre pigtails, forms the tuneable laser module 50. The photodetector 18 is electrically connected to a driver 53. The driver implements the control algorithms for frequency and mode control. When laser is turned on or a channel is switched, the driver reads from the look-up table the current $I_{LD}$ to be applied to the laser diode and the voltage $V_{TM}$ to be applied to tuneable mirror. Then, the driver starts to perform in sequence the closed-loop algorithm for the mode control to align the cavity mode under the selected etalon peak and the algorithm for frequency control to align the channel selector to the oscillating cavity mode. In the set-up, all currents are controlled through the driver 53 by a program running on a PC 54. The feedback information on the alignment of the tuneable mirror is provided by a real-time optical power monitoring circuit and the PC is used as the controller to adjust the tuning voltage to achieve the desired wavelength. The PC is also used as a controller to adjust the injection current of the laser diode to achieve the condition of phase synchronism. It is to be understood that the functions performed by the driver and by the PC, i.e., the controlling device, can be integrated onto a single electronic circuit card that can be integrated to the tuneable laser module. With laser module in this context we refer to a system comprising the laser assembly, optionally packaged in a package housing, and a controlling device, such as an electronic circuit card, apt to align the resonance wavelength $\lambda_{TM}$ of the tuneable mirror to at least one of the cavity modes by analyzing the modulated component of the light beam reflected or transmitted by the tuneable mirror.

Preferably, the tuneable laser module is stabilized in temperature in order to minimize drifting in the optical cavity length and/or to stabilize the phase of the laser cavity. With reference to FIG. 10, the gain medium 10 and the front lens 14 can be mounted on a thermoelectric cooler (TEC) (not shown) having a temperature stability of about 0.2° C.

Temperature control can also allow fine adjustments for frequency stabilization. In this case, a look-up table can be created before laser operation, in which each channel of the ITU grid is associated both to the injection current of the laser diode and to a temperature $T_1$ of the TEC, i.e., of the gain medium. Slight changes in $T_1$ correspond to small changes to the phase of the laser cavity that can thus be adjusted for a fine tuning of wavelength of the cavity mode with the selected wavelength peak of the Fabry-Perot etalon, i.e., $\lambda_{CM}$–$\lambda_{FP}$. A behaviour similar to that shown in FIG. 6 can be found between output power and the laser diode temperature. However, the method of changing the current $I_{LD}$ for cavity mode alignment is preferred because of the ramp rates in temperature variations, which makes the laser response to the instability generally slower.

Preferably, the FP etalon is placed on a TEC having a temperature stability of about 0.2 ° C. Temperature stability of the FP etalon is important in order to lock the etalon peaks to the ITU fringes. Typically, for the commercially available FP etalons, peak frequency temperature sensitivity for alignment to the ITU grid is around 1.3 GHz/° C. The temperature can be set during the initial characterization of the laser system. The tuneable mirror can be placed on the TEC with the FP etalon. Temperature stabilization of the tuneable mirror is especially desirable in case of tuneable mirrors including an LC, as the properties of the LC may change due to thermal fluctuations.

Alternatively, the gain chip, the FP etalon and optionally the tuneable mirror can be placed on the same TEC. Although in this case no phase tuning of the laser cavity by adjusting the temperature is possible, the use of a single TEC can be advantageous in terms of package cost and of a simplified temperature control.

The invention claimed is:

1. A method for selecting the emission wavelength of a tuneable laser having an external-cavity defining a plurality of cavity modes, wherein selecting occurs by means of a tuneable mirror that comprises a diffraction grating and a planar waveguide optically interacting with said diffraction grating, the diffraction grating and the planar waveguide forming a resonant structure, the tuneable mirror further comprising a light transmissive material having an index of refraction that varies in response to an electric field applied to the light transmissive material, making the tuneable mirror electrically tuneable, comprising the steps of:
    emitting a light beam by a gain medium to the external cavity;
    applying an alternating voltage of an amplitude to the light transmissive material of the tuneable mirror at a frequency $f_A$, thereby selecting a resonance wavelength of the resonance structure and thereby modulating in amplitude the light beam reflected or transmitted by the tuneable mirror; and
    aligning the resonance wavelength of the tuneable mirror to at least one of the cavity modes by analysing the modulated component of the light beam reflected or transmitted by the tuneable mirror,
    wherein the step of aligning the resonance wavelength is carried out by changing the amplitude of the voltage applied to the tuneable mirror so as to minimise the amplitude of the modulated component of the light beam either reflected by the tuneable mirror or transmitted through the tuneable mirror.

2. The method as in claim 1, wherein the amplitude modulation of the light beam reflected by or transmitted through the tuneable mirror is controlled to be not larger than ±2%.

3. The method as in claim 2, wherein the amplitude modulation of the light beam reflected by or transmitted through the tuneable mirror is controlled to be not larger than ±1%.

4. The method as in claim 1, wherein the analysed modulated component is at frequency $f_A$.

5. The method as in claim 1, wherein the analysed modulated component is at frequency $2f_A$.

6. The method as in claim 1, wherein selecting by means of the tuneable mirror comprises introducing a filtering element between the gain medium and the tuneable mirror, a spectrally selective loss element defining at least a pass band comprising the at least one of the cavity modes.

7. The method as in claim 6, wherein the spectrally selective loss element is a grid element defining a plurality of pass bands substantially aligned with corresponding channels of a wavelength grid.

8. The method as in claim 6, further comprising the step of aligning a pass band of the spectrally selective loss element to the at least one of the cavity modes by adjusting the injection current of the gain medium so as to maximize the laser output power.

9. The method as in claim 8, wherein the step of aligning a pass band of the spectrally selective loss element to the at least one of the cavity modes and the step of aligning the resonance wavelength of the tuneable mirror to the at least one of the cavity modes are carried out sequentially.

10. A tuneable laser module configured to emit output radiation on a single longitudinal mode at a laser emission wavelength, comprising:
    an external cavity defining a plurality of cavity modes;
    a gain medium to emit a light beam into the external cavity;
    a tuneable mirror comprising a diffraction grating and a planar waveguide optically interacting with said diffraction grating, the diffraction grating and the planar waveguide forming a resonant structure, the tuneable mirror further comprising a light transmissive material having an index of refraction that varies in response to an electric field applied to the light transmissive material, making the tuneable mirror electrically tuneable in response to an alternating voltage of an amplitude and frequency, so as to select a resonance wavelength and so as to modulate in amplitude the light beam reflected or transmitted by the tuneable mirror; and
    a controlling device to align the resonance wavelength of the tuneable mirror to at least one of the cavity modes by analysing a modulated component of the light beam reflected or transmitted by the tuneable mirror,
    wherein the controlling device carries out a function of analysing the modulated component of the light beam either reflected by the tuneable mirror or transmitted through the tuneable mirror by changing the amplitude of the voltage applied to the tuneable mirror so as to minimise the amplitude of the modulated component of the light beam.

11. The tuneable laser module according to claim 10, wherein the controlling device is included in an electronic circuit card.

* * * * *